(12) United States Patent
Bloom et al.

(10) Patent No.: US 6,194,979 B1
(45) Date of Patent: *Feb. 27, 2001

(54) BALL GRID ARRAY R-C NETWORK WITH HIGH DENSITY

(75) Inventors: Terry R. Bloom, Middlebury; Richard O. Cooper, Bluffton; Robert L. Reinhard, Berne, all of IN (US)

(73) Assignee: CTS Corporation, Elkhart, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/272,189

(22) Filed: Mar. 18, 1999

(51) Int. Cl.$^7$ ................................. H01P 1/24; H01P 1/26
(52) U.S. Cl. ..................... 333/22 R; 333/172; 361/766
(58) Field of Search .................... 333/22 R, 172; 257/533; 361/766; 338/312

(56) References Cited

U.S. PATENT DOCUMENTS

| | | |
|---|---|---|
| 3,280,378 | 10/1966 | Brady et al. . |
| 3,346,774 | 10/1967 | Brady . |
| 3,492,536 | 1/1970 | Girolamo et al. . |
| 4,300,115 | 11/1981 | Ansell et al. . |
| 4,332,341 | 6/1982 | Minetti . |
| 4,626,804 * | 12/1986 | Risher et al. ............... 333/22 R |
| 4,654,628 | 3/1987 | Takayanagi . |
| 4,658,234 | 4/1987 | Takayanagi . |
| 4,945,399 | 7/1990 | Brown et al. . |
| 5,216,404 | 6/1993 | Nagai et al. . |
| 5,379,190 | 1/1995 | Hanamura et al. . |
| 5,539,186 | 7/1996 | Abrami et al. . |
| 5,557,502 | 9/1996 | Banerjee et al. . |
| 5,621,619 | 4/1997 | Seffernick et al. . |
| 5,661,450 | 8/1997 | Davidson . |
| 5,760,662 * | 6/1998 | Kalb et al. ..................... 333/172 |
| 5,923,077 * | 7/1999 | Chase et al. ............... 257/533 X |
| 5,977,863 | 11/1999 | Bloom et al. . |
| 6,005,777 * | 12/1999 | Bloom et al. ................. 361/766 |

* cited by examiner

Primary Examiner—Benny Lee
Assistant Examiner—Stephen E. Jones
(74) Attorney, Agent, or Firm—Mark P. Bourgeois; Mark W. Borgman; Al Watkins

(57) ABSTRACT

A wave transmission line terminator having application in computer data buss termination, single and multiple channel analog transmission line termination and other similar terminations uses thick film components including resistors and capacitors in combination with a ball grid array termination. The thick film resistors are placed on a first side of a substrate opposite the capacitors and ball grid array, and are electrically connected thereto by electrically conductive vias in the substrate. Several different configurations are disclosed which make the terminator more suitable for specific application.

16 Claims, 5 Drawing Sheets

BALL GRID ARRAY R-C NETWORK WITH HIGH DENSITY

BACKGROUND OF THE INVENTION

1. Field of the Invention

This invention pertains generally to wave transmission lines and networks, and more specifically to thick film type dissipating terminations that match the characteristic impedance of a transmission line.

2. Description of the Related Art

Transmission lines are used in a diverse array of electronic equipment to accommodate transmission of electrical or electronic signals. These signals may have a diverse set of characteristics, which might, for example, include direct or alternating currents, analog or digitally encoded content, and modulation of any of a diverse variety of types. Regardless of the characteristics of the signal, an ideal transmission line will conduct the signal from source to destination without altering or distorting the signal. Distance is inconsequential to this ideal transmission line, other than delays which might be characteristic of the transmission medium and the distance to be traversed.

At low frequencies and with direct current transmissions, many transmission lines perform as though they are nearly ideal, even over very great distances. Unfortunately, as the frequency of the signal increases, or as the frequency of component signals that act as a composite increases, the characteristics of most common transmission lines decay and signal transmission progressively worsens. This is particularly true when signals reach the radio frequency range or when transmission lines become longer. One common phenomenon associated with high frequency, long distance transmission lines is a loss of the signal's high frequency components and the introduction of extraneously induced interfering high frequency signals. Another common phenomenon is echo or line resonance, where a signal may be reflected from one end of the transmission line back to the other. This echo, in the case of analog voice signals, is commonly known as reverberation, which leads to the effect of one sounding like speech is emanating from within a barrel. The auditory reverberation within a barrel generates a sound similar to the sound after an electrical signal echoes within a transmission line. In the case of a digital pulse, the effect will lead to corrupted data, since additional pulses may be received that were not part of the original transmission, and reflected pulses may cancel subsequent pulses.

In a number of electrical and electronic fields, new circuitry is being developed that has ever increasing capability for higher frequencies. The benefits of these higher frequency components is realized in faster computer processing, in the case of data processing, or broader bandwidth transmissions which can carry more voice signals, more television and radio signals and other signals all over the same communications channel. However, as these communications channels utilize ever-increasing frequencies, the limitations of conventional transmission lines are accentuated. In the case of copper transmission lines, radiation from a signal conductor is dependent directly upon the transmission line length and relative proximity of adjacent signal conductors. So, for example, a long signal line adjacent to another long signal line causes trouble even at lower frequencies. The original telephone lines were twisted in a particular way to reduce signal coupling between separate telephone lines. This signal coupling was aptly referred to in the art by the phrase "cross-talk", since signals from one telephone conversation would cross the lines into a different telephone line, resulting in talking which crossed the wires improperly. Cross-talk, as aforementioned, is dependent in part upon the spacing between adjacent signal lines. One method of reducing cross-talk is to increase spacing between lines. Unfortunately, another objective in the field of electronics is reduction of the size of components and systems. Simply increasing the spacing often results in greater expense, and also slower overall systems operation speeds—defeating the benefits which were otherwise attained by operating at higher frequencies. Another disadvantage of increased spacing comes from signal radiation. When a copper transmission line is made longer, the conductor will radiate and receive more high frequency energy. So, it is desirable to keep transmission lines shorter, not longer as might otherwise be dictated by cross-talk factors.

To prevent echo within a transmission line, it is possible to terminate the line with a device which is referred to in the art as an energy dissipating termination. The termination must have an impedance which is designed to match the characteristic impedance of the transmission line as closely as possible over as many frequencies of interest as possible. Transmission lines generally have an impedance which is based upon the inductance of the conductor wire, capacitance with other signal lines and ground planes or grounding shields, and resistance intrinsic in the wire. With an appropriate transmission line, the sum of the individual impedance components is constant and described as the "characteristic impedance." To match the transmission line characteristic impedance over a wide frequency range, a termination must also address each of the individual impedance components. The effect of inductance is to increase impedance with increasing frequency, while capacitance decreases impedance with increasing frequency. Intrinsic resistance is independent of frequency.

In the particular field of data processing, transmission lines typically take the form of busses, which are large numbers of parallel transmission lines along which data may be transmitted. For example, an eight bit data bus will contain at least eight signal transmission lines that interconnect various components within the data processing unit. The data bus is actually a transmission line having to accommodate, with today's processor speeds, frequencies which are in the upper radio frequency band approaching microwave frequencies. These high frequency busses are, in particular, very susceptible to inappropriate termination and transmission line echo.

Terminations used for these more specific applications such as the data processor bus serve several purposes. A first purpose is, of course, to reduce echoes on the bus by resistively dissipating any signals transmitted along the bus. This first purpose is found in essentially all termination applications. A second purpose, more specific to data busses or other similar electronic circuitry, is to function as what is referred to in the art as a "pull-up" or "pull-down" resistor. The termination resistor will frequently be connected directly to either a positive power supply line or positive power supply plane, in which case the termination resistor is a "pull-up" resistor, or the resistor may be connected to either a negative or ground line or plane, in which case the resistor is referred to as a "pull-down" resistor. When no signal is present on the line, the voltage on the transmission line will be determined by the connection of the termination resistor to either a power supply line or a ground or common line. Circuit designers can then work from this predetermined bus voltage to design faster, more power-efficient components and circuits.

The prior art has attempted to address signal line termination in a number of ways which were suitable at lower operating speeds and frequencies, but which have not proven fully desirable as frequencies and components thereof increase. To address higher frequency signals, such as might be encountered in data processing computers, for example, smaller, more compact resistors are required. These resistors may be formed by one of several common processes. One such process is referred to as thin film, which might include vapor deposition techniques, sputtering, semiconductor wafer type processing, and other similar techniques. An example of a thin film component is found in U.S. Pat. No. 5,216,404 to Nagai et al. These thin film production techniques require special vacuum chambers which make sequential, continuous production very difficult if not impossible. Each time the controlled atmosphere is breached, new variables are introduced into the process that are difficult to control. Furthermore, materials available to be processed by thin film techniques are still relatively limited. Adjustment of the thin film component after formation is quite difficult. Between materials and process challenges, the thin film products tend to have poor yield, are relatively expensive due to the yield and difficult processing requirements, and are variable with respect to environmental factors such as temperature and humidity. In addition, as a result of the thin film and resultant low mass of the thin film product, these components are also relatively fragile and easily damaged. Even small discharges of static electricity can destroy these parts.

Thick film components, herein considered to be components that are formed from a layer of Cermet or dielectric material deposited upon a non-conductive substrate, are most commonly formed from screen printing techniques. Other processes may be used to form thick film components such as lamination, or from subtractive processes including etching. For the purposes of this application, thick films are defined as films formed when specially formulated pastes or inks are applied and fired or sintered onto a substrate in a definite pattern and sequence to produce a set of individual components, such as resistors and capacitors, or a complete functional circuit. The pastes are usually applied using a screen printing method and may typically have a thickness of from 0.5 to 1 mil or more, and are well known in the industry. Cermet materials are materials comprising ceramic or glass in combination with metal compositions, where the first three letters: CER & MET make the word CERMET.

TCR stands for Temperature Coefficient of Resistance, which is a measure of the amount of change in resistance over some temperature range. Sheet resistivity for the purposes of this disclosure is measured in the units of ohms per square. This will be considered herein to be the resistance of a 1 mil thick film of equal length and width.

Low TCR thick film resistors may be readily manufactured that are both durable and have excellent TCR. These resistors may have sheet resistances that vary from fractions of an Ohm to millions of Ohms per square with a TCR less than ±100 ppm/° C. The performance of these resistors is excellent, and they may be patterned and trimmed by laser ablation, mechanical methods or most simply by altering patterns in the screen to form very tight spirals. As a result of the many excellent characteristics of thick film materials, these materials are most desirably incorporated into transmission line terminations.

However, as frequencies increase, there is great demand to decrease the size of the components. For example, inductance increases with length. Therefore, to minimize inductance in the termination, signal lines should be kept as short as possible. Furthermore, shorter line lengths decrease the undesirable cross-talk described hereinabove. Stray capacitance should be minimized, since this stray capacitance is frequently variable with temperature due to temperature related variations in ordinary dielectrics.

In the prior art, transmission line terminations were initially constructed using large Cermet resistors which were formed by thick film techniques upon alumina (aluminum oxide) substrates. These components were the mounted into a circuit board in a Single-In-line Package (SIP) format. Several examples of these components may be found in U.S. Pat. Nos. 3,280,378 to Brady et al, 3,346,774 to Brady, 3,492,536 to Di Girolamo et al, each assigned to the present assignee, and also 4,654,628 and 4,658,234 to Takayanagi, all which are incorporated herein by reference. Due to the SIP format, one termination conductor must extend up from the substrate to a resistor, but additionally a second termination must extend up from the substrate and fully pass around the full length of the resistor, finally extending over the top of the resistor and terminating thereto. As a result, the effective conductor lead length found in these SIP components must be greater than the actual resistor length, and in most cases several times the resistor length. As lead length increases, so does line inductance, which then increases impedance to the high frequency components. When the inductance is too great from lead length, the termination device will not match the transmission line, and echoes will be generated as aforementioned, thereby corrupting data transmission or diminishing analog signal quality.

A second type of cermet termination has been developed, commonly referred to in the art as a "chip" type component. A flat substrate has resistors and terminations patterned thereon, and, unlike the SIP configuration, the chip component is laid flat onto the substrate. One example of the chip type component is illustrated in U.S. Pat. No. 5,379,190, the contents of which are also incorporated herein by reference. Since the chip is flat on the substrate, the chip component itself has shorter lead lengths. However, there are several very pronounced disadvantages of these chip components. A first disadvantage is the amount of circuit board real-estate which is consumed by the component. One of the reasons for the SIP configuration was to use as little circuit board surface area as possible. Circuit board real-estate is precious for two reasons. First of all, when a component uses more of the surface, wires must travel further to get past the component. As aforementioned, this means that the transmission line lengths are greater and radiation and the potential for cross-talk are greater. In addition, the circuit board itself has a price per unit area, which must be added to the component cost in an amount equal to the amount of surface area taken by the component. Another serious drawback is that, while the chip component lead lengths are shorter, the actual line lengths may, in fact, be no shorter, depending upon where the lines are routed from the chip into the circuit board pattern. In other words, while the distance on the chip is shorter, the actual total line length may not be any shorter.

To retain the size advantages of the SIP components, Seffernick et al in U.S. Pat. No. 5,621,619, assigned to the present assignee and incorporated herein by reference, developed a DIP configuration of reduced size and spacing smaller than ordinarily obtainable with solder paste and thick film Cermet compositions. Nevertheless, there is a continuing demand for even smaller and higher frequency transmission line terminations.

One method of component attachment which has proven beneficial in higher frequencies is the Ball Grid Array (BGA) package. In this package, connection between a printed circuit board and the BGA component is achieved through the use of a number of solder balls. These balls are not limited to placement around the periphery of the device, as was the case in the chip resistors of the prior art, but instead the BGA has terminations distributed in the array across the entire package. As a result, the printed circuit board real-estate may be consumed by the connection (the BGA), making this type of connection comparable in real-estate economy to the earlier SIP designs. In addition, the circuitry may be connected directly through the component substrate to the BGA, meaning that lead lengths may be limited solely to the thickness of the component substrate. These resultant leads are generally much shorter even than the leads found on chip components. Examples of these BGA type terminations are found in U.S. Pat. Nos. 4,332, 341 to Minetti; 4,945,399 to Brown et al; 5,539,186 to Abrami et al; 5,557,502 to Banerjee et al; and 5,661,450 to Davidson. Each of these patents illustrate various types of BGA components and packages, the contents which are incorporated herein by reference. While each of these patents illustrate various components, including termination resistor arrays and, separately, decoupling capacitors, none illustrate a high density thick film type termination network which has the benefits of resistors and capacitors integrated therein. Yet, such a device is needed in the art to provide the characteristics which are desired for many different types of transmission lines, including but not limited to the analog and digital lines described hereinabove.

SUMMARY OF THE INVENTION

In a first manifestation, the invention is an energy dissipating wave transmission line terminator made from an electrically insulating substrate. A thick film resistor is formed on one side of the substrate, and a thick film capacitor is formed on a second side of the substrate. Through the substrate an electrical connection connects the resistor to the capacitor, and an electrically conductive ball adjacent the capacitor serves as one electrical connection point for the terminator.

In a second manifestation, the invention is a ball grid array resistor capacitor network, comprising an electrically insulating substrate, an electrically resistive pattern on the substrate, first and second electrical conductors passing through the substrate and connecting to the resistive pattern, first and second electrically conductive electrodes carried upon a second surface of the substrate different from the resistive pattern, having a first dielectric material and thereby having a first measurable electrical capacitance and so forming a first capacitor, one of the said first and second electrically conductive electrodes electrically connected to the resistive pattern, and a first electroconductive ball electrically connected to one of the first and second electrically conductive electrodes.

In a further manifestation, the invention is a circuit module having a substrate, capacitors and resistors supported thereon, wherein the improvement comprises a ball grid array attached and electrically connected to the capacitors and resistors, and wherein the capacitors are adjacent the ball grid array and resistors are opposite of the capacitors and ball grid array relative to the substrate.

Other features are contemplated, such as connecting resistors directly out to a ball on the second side of the substrate, or, alternatively, through additional capacitors to other balls. Arrays of resistors and capacitors are also contemplated, as are different compositions and electrical arrangements for differing applications.

OBJECTS OF THE INVENTION

A first object of the present invention is to provide a very high density thick film resistor capacitor network utilizing the benefits of thick film in combination with the ball grid array. A second object is to minimize connection inductance from the network to a circuit board by keeping connection wiring as short as possible. Another object is to use the thick film materials effectively to ensure that the resulting wave transmission line termination is as economical as possible while still offering the superior high frequency performance desired. Yet a further object of the invention is to be able to provide energy dissipating terminations for a wide variety of transmission lines, including computer data busses, AC signal lines, voice and other analog transmission lines, and other transmission lines which require the features and advantages of the present invention.

DESCRIPTION OF THE PREFERRED EMBODIMENT

Figure 1:
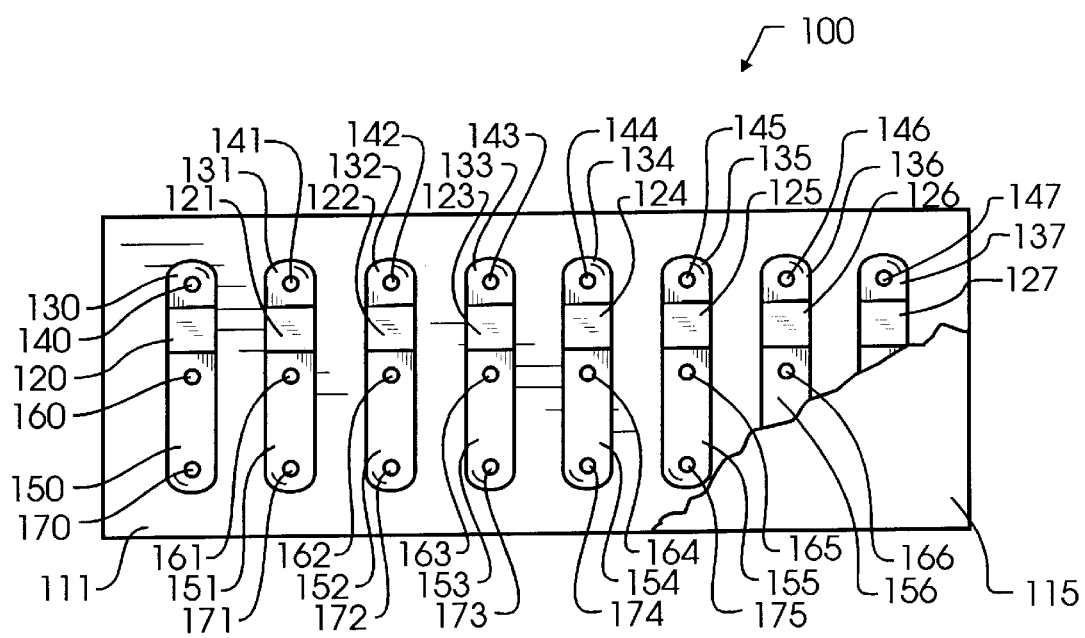
FIG. 1 illustrates a first embodiment of the invention from a top plan view.
Figure 2:
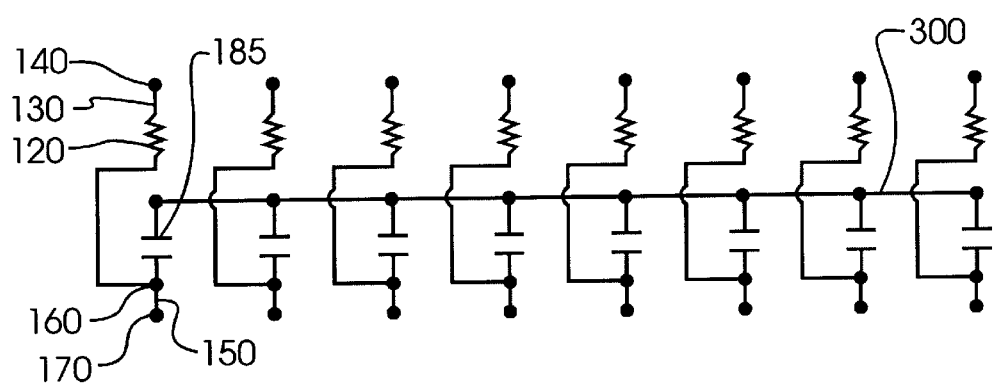
FIG. 2 illustrates the embodiment of FIG. 1 schematically.
Figure 3:
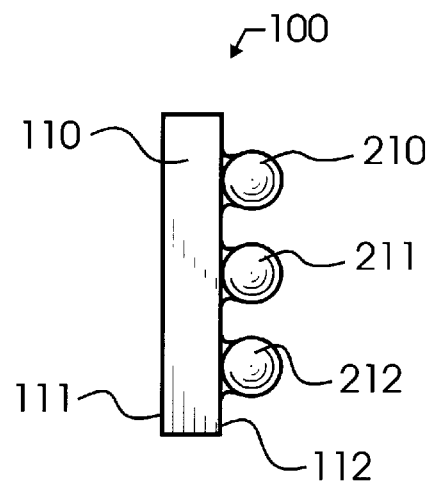
FIG. 3 illustrates the embodiment of FIG. 1 from side view.
Figure 4:
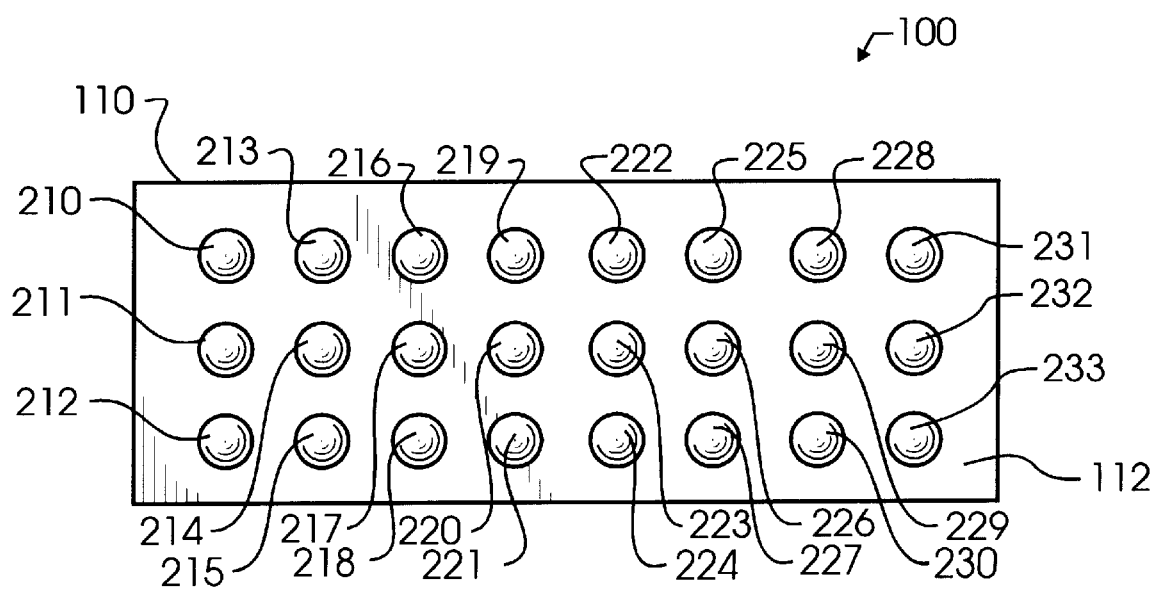
FIG. 4 illustrates that same embodiment from a bottom view.

Wave transmission line terminator 100 is illustrated from plan views in FIGS. 1, 3 and 4, and schematically in FIG. 2. Where possible, like components have been numbered as similarly as possible to simplify reference purposes. Wave transmission line terminator 100 includes a substrate 110 upon which thick film components may be formed and, preferably, fired or sintered, as is known in the thick film industry. This substrate will typically be alumina, though any of the many thick film substrate compositions could be used. Onto a top surface of substrate 110, visible in FIG. 1 with covercoat 115 partly removed therefrom for illustration purposes, an array of thick film Cermet resistors 120–127 and conductors 130–137 and 150–156 are patterned. Within each of the conductors 130–137 and 150–157 are small through-hole conductors 140–147 and 160–175, respectively, which serve to electrically interconnect from the top surface 111 of substrate 110, visible in FIG. 1, electrically through substrate 110 to bottom surface 112 visible in FIG. 4. These through hole conductors may be manufactured from a variety of known techniques, including but not limited to commercial Cermet through-hole pastes, solid pins or plugs, refractory metallizations, or alloyed compositions. However, the through-hole conductors should be selected from a material and manufacturing process which is otherwise electrically and mechanically compatible with the other thick film components of the preferred embodiments.

As visible in FIGS. 3 and 4, solder balls 210–233 are placed and substantially cover the bottom surface 112 of substrate 110. These solder balls serve to electrically connect termination 100 to a mother board or other printed circuit or carrier substrate. As is evident from FIG. 3, these solder balls may be manufactured to be quite small, substantially only limited by the smallest sizes that may be produced. These balls may, in fact, be measured in thousandths or hundredths of an inch in diameter, compared to the prior art SIP terminations which are measured in hundredths or tenths of an inch. Since the entire bottom surface 112 is covered by the ball grid array, there is no wasted surface real-estate on the carrier circuit board, such as a mother board, to which this component is attached. In addition, the signals that termination 100 interacts with must only pass through the thickness of substrate 110 and the diameter of solder balls 210–233, thereby keeping lead lengths as short as possible.

Figure 7:
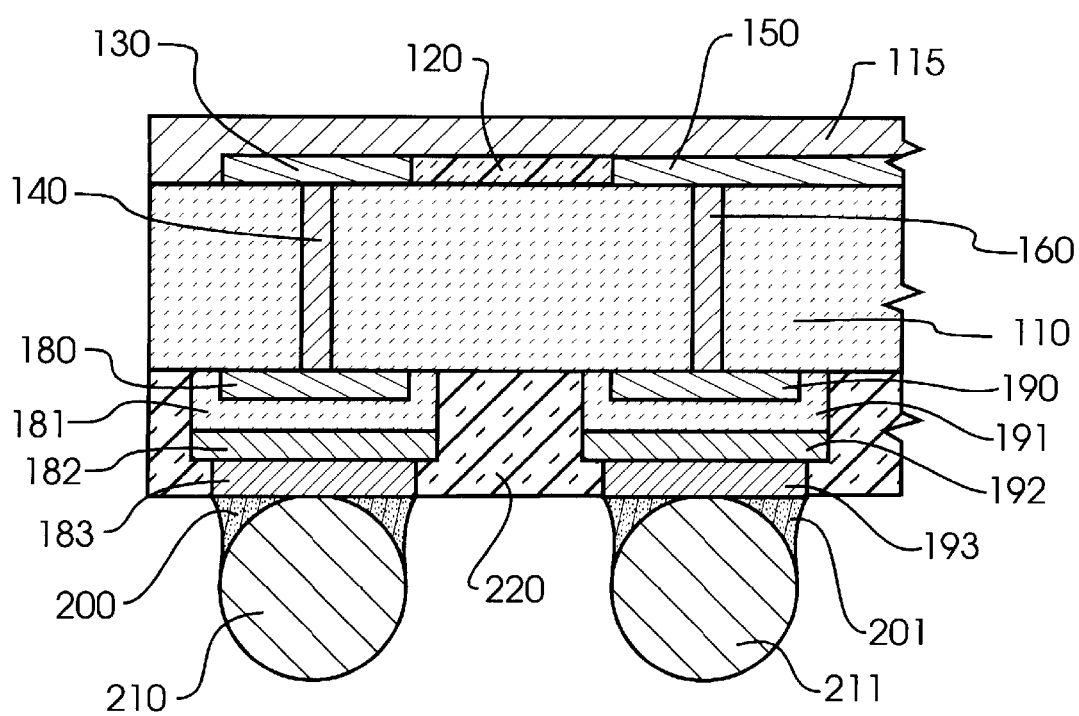
FIGS. 7 and 8 illustrate two alternative embodiments for thick film capacitor construction in accord with the present invention.
Figure 8:
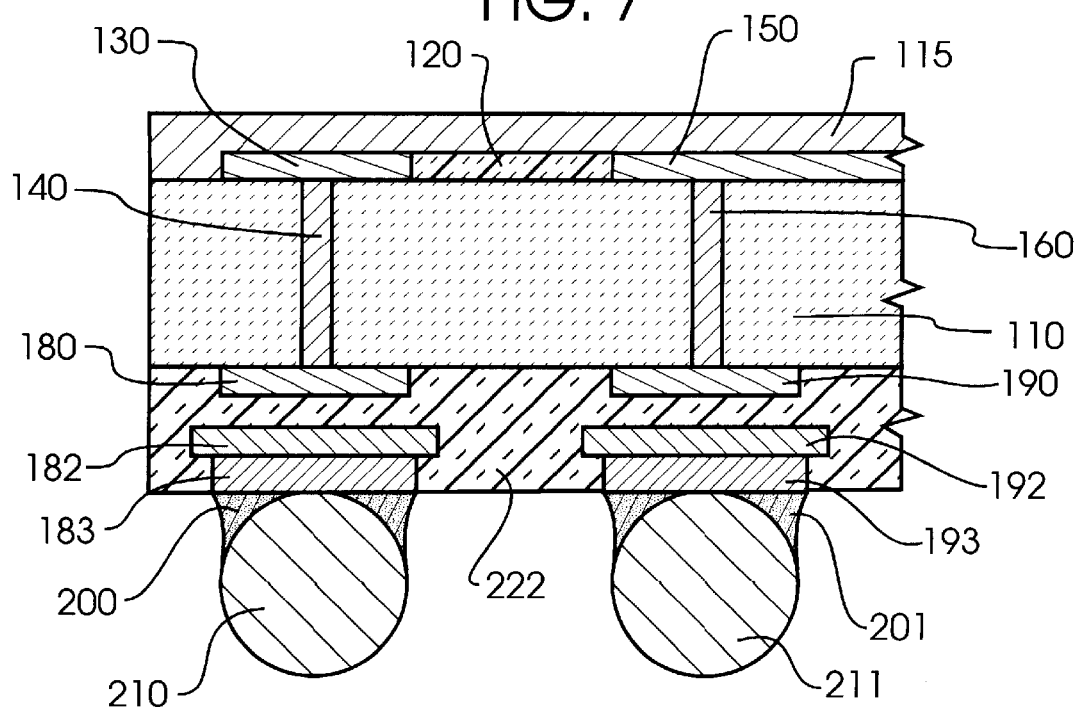

Not visible in FIGS. 1, 3 and 4 is the actual placement of capacitors such as capacitor 185. FIG. 7 illustrates one embodiment of the placement of these capacitors, while FIG. 8 illustrates an alternative embodiment. In the preferred embodiment, capacitors are formed from commercially available thick film materials as is known in the art by screen printing electrodes 180 and 190 onto substrate 110. More preferably, to avoid the need for any additional routing, these electrodes are screen printed directly onto vias 140, 160 to form reliable electrical connection. A capacitor is formed when two electrodes are spaced by a dielectric material. As is known, the dielectric material may take any of a fairly wide variety of materials. However, in the thick film arena, titanates such as barium titanate are generally preferred due to their relatively high dielectric constants. Where lower value capacitors are deemed to be adequate for a particular application, other dielectrics such as oxides of silicon and aluminum may be adequate. As shown in FIG. 7, layers 181 and 191 are special dielectrics such as the titanate type. On top of the dielectric layer, an additional electrode 182, 192 is patterned. While not essential to the workings of the invention, an additional electroconductive solder barrier layer 183, 193 is preferably patterned which acts as a protective layer to preserve electrodes 182, 192 and dielectrics 181, 191 from attack by fluxes found in subsequently applied solder paste 200, 201. A dielectric barrier 220, which may also be a refractory dielectric composition, is also formed to enclose and protect the electrical components. Within solder paste 200, 201, a solder ball or other shaped preform 210, 211 may be applied in the preferred embodiment. By working with preforms such as the balls illustrated, it is possible to achieve consistent dimensional control over the components, where a reflowed extension could be more difficult to control during manufacture. So while preforms are preferred, other methods of forming electrical attachment points to the terminators and networks of the present invention are contemplated and included herein, to the extent such terminations are known or would be obvious to those skilled in the art.

In an alternative embodiment of FIG. 8, a dielectric layer 222 may serve the combined function of passivation and protection of electrical components and also act as a dielectric for each of the capacitors. Typically, such a composition may be formed from a mixture of various oxides of silicon, boron, aluminum, calcium, sodium, magnesium, lithium and other elements known to form satisfactory dielectric layers, though the invention is not so limited.

While FIGS. 7 and 8 illustrate by cross-section view one possible construction of the invention, variations are certainly possible. One frequent variation is in the interconnection between resistive cermet material 120 and electrically conductive materials 130, 150. Frequently, conductive materials 130, 150 are deposited first, and then resistive material 120 overlayed thereon, including a certain amount of overlap therebetween to ensure high quality electrical interconnection after sintering or firing. In addition, both FIGS. 7 and 8 illustrate capacitors intervening between vias 140, 160 and electroconductive balls 210, 211. There is no particular requirement that each via be terminated by a capacitor, and, as will next be described, an electroconductive ball may be placed directly upon a solder barrier layer such as layer 193 which could be directly attached to via 160, or solder ball 211 could even conceivably be directly attached to an electroconductive pad such as pad 190 or to via 160, though, for long term performance, these approaches may not be as desirable.

The schematic of FIG. 2 illustrates one possible circuit configuration of the structure shown in FIG. 1. Eight different sets of resistors and capacitors are illustrated and will be understood to directly correspond with the components illustrated graphically in FIG. 1, but for the purposes herein only one such combination will be discussed in detail. Furthermore, it will be apparent that many different numbers of components may be combined in accord with the present teachings for any given application, and particular numbers of components may lend special significance to only one or a few of the preferred specific applications. As can be seen in FIG. 2, resistor 120 is connected through conductor 130 to via 140. Via 140 will be terminated on an opposite side of substrate 110 with a solder ball for direct interconnection to a carrier board such as a printed circuit board, or mother board. At a second electrical connection or termination of resistor 120 is conductor 150, which connects through via 160 to capacitor 185. In addition, conductor 150 extends to via 170, which passes through substrate 110 to direct connection with a solder ball. By arranging an array of these devices similarly, and then connecting capacitors together with a common line 300, which may be provided for either on termination 100 or within the carrier circuit board, an array of eight R-C low pass filters are provided. This configuration has application such as electromagnetic or radio frequency interference filtering, and low pass signal filtering.

Figure 5:
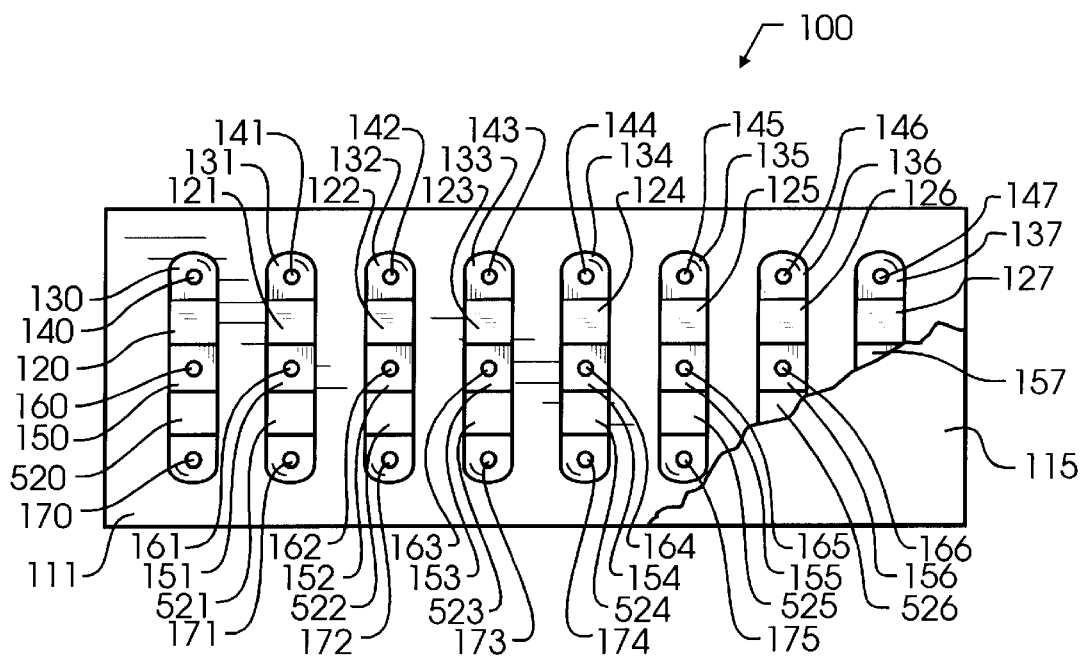
FIG. 5 illustrates a second embodiment from a top plan view.
Figure 6:
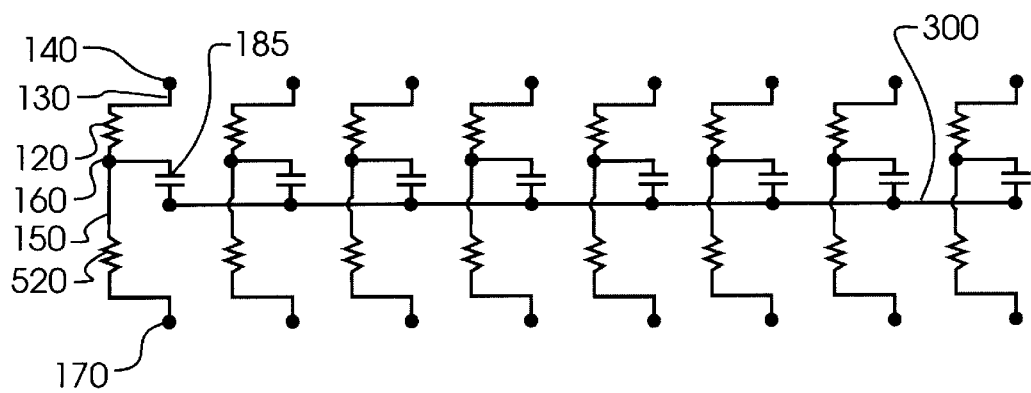
FIG. 6 illustrates the second embodiment schematically.

Various other interconnections may be made with this basic network, as, for example, illustrated in FIGS. 5 and 6. Therein, an additional resistor 520 is provided which like resistor 120, has a first end connected directly to a solder ball and a second end connected electrically to a capacitor. This particular arrangement has similar application, and may also find utility in liquid crystal display panel filters.

Figure 9:
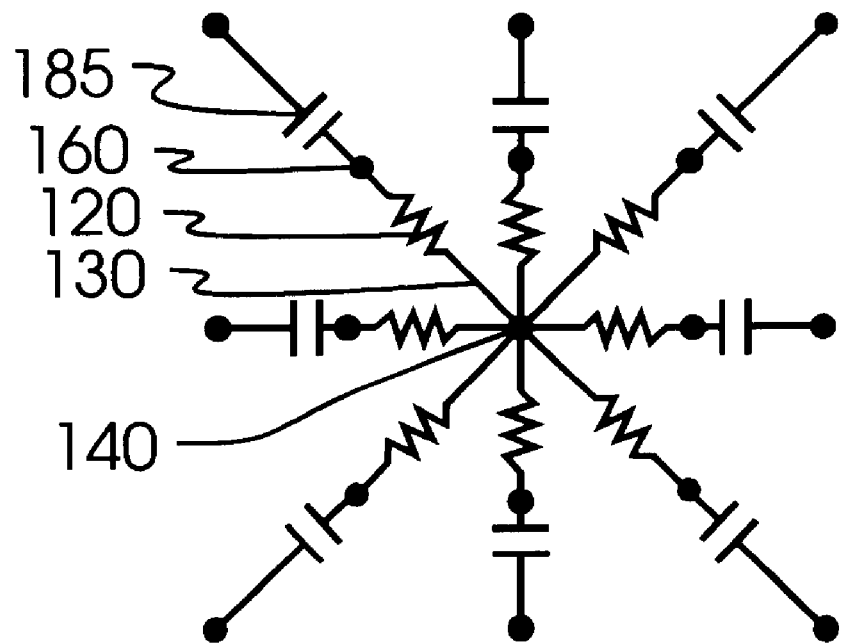
FIG. 9 illustrates an AC terminator schematically which embodies the features of the present invention.

FIG. 9 illustrates yet another arrangement. As shown in FIG. 9, the capacitors and resistors are arranged in what is know of in the electrical art as a "Y" configuration or star configuration. This type of termination acts as an AC line termination, since the series arrangement of capacitors block all DC components. The schematic illustration is arranged in what could be a similar physical layout, where a 3×3 array of solder balls is arranged to have eight exterior balls alternately at the corners or half-way therebetween around the periphery of a substrate 110, each having a capacitor directly thereunder similar to the balls 210, 211 of FIGS. 7 and 8. On a surface opposite the balls and capacitors, an array of resistors in the star pattern may all extend to a common central via for common termination. Other similar configurations are possible which optimize the surface area of a substrate and yet still provided the many benefits of the present invention. Such AC configurations as delta arrangements are conceived of, as well as a myriad of other arrangements which will be apparent to those skilled in the art, upon a reading of the present disclosure when faced with a particular need.

While the foregoing details what is felt to be the preferred embodiment of the invention, no material limitations to the scope of the claimed invention are intended. Further, features and design alternatives that would be obvious to one of ordinary skill in the art upon a reading of the present disclosure are considered to be incorporated herein. The scope of the invention is set forth and particularly described in the claims hereinbelow.

We claim:

1. An energy dissipating wave transmission line terminator having low intrinsic inductance and minimal cross-talk between various signal carrying lines within said wave transmission line terminator, comprising:

a) a generally electrically insulating substrate having a first major surface, a second major surface and a thickness therebetween;

b) a first plurality of thick film material resistors formed on said first major surface, each one of said plurality of resistors having a first termination and a second termination;

c) a first plurality of thick film material capacitors formed on said second major surface, each one of said plurality of capacitors having a first electrode adjacent said second major surface and a second electrode distal to said second major surface;

d) a first plurality of electrical connections extending through said substrate thickness, connecting ones of said plurality of resistors to ones of said plurality of capacitors at said first capacitor electrodes to form a plurality of transmission line terminations for terminating ones of said various signal carrying lines; and e) a ball grid array including a plurality of balls, ones of said plurality of balls positioned adjacent to said first plurality of thick film capacitors and electrically connected to said second capacitor electrodes.

2. The energy dissipating wave transmission line terminator of claim 1, further comprising a second plurality of electrical connections extending through said substrate thickness and electrically connecting said first plurality of resistors at said resistor second terminations through said substrate to said second major surface.

3. The energy dissipating wave transmission line terminator of claim 1, further comprising a titanate dielectric between said first and second capacitor electrodes.

4. The energy dissipating wave transmission line terminator of claim 1, further comprising an oxide dielectric between said first and second capacitor electrodes.

5. The energy dissipating wave transmission line terminator of claim 1, wherein said each one of said plurality of resistors is electrically coupled to only an individual one of said first plurality of capacitors, thereby forming an array of single resistor, single capacitor R-C networks.

6. The energy dissipating wave transmission line terminator of claim 1, wherein said each one of said plurality of resistors is electrically coupled to another one of said plurality of resistors and also to said ones of said plurality of capacitors, thereby forming an array of two resistor, single capacitor R-C networks.

7. The energy dissipating wave transmission line terminator of claim 6, wherein said plurality of resistors and said plurality of capacitors are physically arranged in a rectangular array.

8. The energy dissipating wave transmission line terminator of claim 1, wherein said each one of said plurality of resistors share an electrically common second termination.

9. The energy dissipating wave transmission line terminator of claim 8, wherein said each one of said plurality of resistor extend radially from said electrically common second termination across said first major surface.

10. A ball grid array resistor capacitor network, comprising:

a) an electrically insulating substrate having a first surface, a second surface, and a thickness between said first and second surfaces;

b) an electrically resistive pattern on said first surface having a first and a second electrical connection, whereby electrical energy may pass from said first electrical connection through said electrically resistive pattern to said second electrical connection and wherein a first part of said electrical energy will be dissipated therein;

c) a first and second electrical conductor, passing through said thickness, and connecting to said first and second electrical connections, respectively;

d) a first and second electrically conductive electrode, carried upon said second surface, having a first dielectric material therebetween, and thereby having a first measurable electrical capacitance therebetween thereby forming a first capacitor, wherein one of said first and said second electrically conductive electrodes is electrically connected to said first electrical connection; and e) a first electroconductive ball electrically and mechanically connected to a first one of said first and second electrically conductive electrodes;

f) additional electrically resistive patterns on said first surface, each having two electrical connections, all of said electrically resistive patterns sharing one of said two electrical connections in common through a common electrical conductor; and g) additional capacitors on said second surface electrically connected to said electrically resistive patterns and to additional electroconductive balls;

h) wherein said first and additional capacitors block the flow of DC current through said first and additional resistors, while simultaneously passing AC current therethrough, whereby said ball grid array resistor capacitor network may terminate an AC wave transmission line.

11. The ball grid array resistor capacitor network of claim 10, wherein said electrically resistive pattern comprises a cermet material.

12. In combination, a circuit board having a plurality of conductors and a highly compact circuit module having a first surface, a second surface and a thickness therebetween, wherein the improvement comprises:

a ball grid array electrically coupling said circuit module to said plurality of conductors;

a plurality of capacitors supported by said circuit module adjacent said ball grid array and said first surface of said circuit module;

a plurality of resistors supported by said circuit module adjacent said second surface of said circuit module; and a plurality of electrically conductive vias extending through said thickness of said circuit module, electrically coupling said plurality of resistors to form a plurality of resistor-capacitor networks electrically coupled to said plurality of conductors.

13. The circuit module of claim 12, wherein said plurality of electrically conductive vias electrically connect selected ones of said plurality of resistors to selected ones of said plurality of capacitors.

14. The circuit module of claim 12 whether plurality of electrically conductive vias electrically connects selected ones of said plurality of resistors directly to said ball grid array.

15. The circuit module of claim 12, wherein said plurality of resistors are thick film resistors.

16. The circuit module of claim 12, wherein said plurality of capacitors are thick film capacitors.

* * * * *